US006271118B1

(12) United States Patent
Wu et al.

(10) Patent No.: US 6,271,118 B1
(45) Date of Patent: Aug. 7, 2001

(54) METHOD OF APPLYING PARTIAL REVERSE MASK

(75) Inventors: Juan-Yuan Wu, Hsinchu; Water Lur, Taipei, both of (TW)

(73) Assignee: United Microelectronics Corp., Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,843

(22) Filed: Feb. 1, 1999

(51) Int. Cl.$^7$ .................. H01L 21/4763; H01L 21/44; G03C 5/00
(52) U.S. Cl. .................. 438/624; 438/633; 438/637; 438/638; 438/669
(58) Field of Search .................. 438/597, 619, 438/622, 623, 624, 631, 633, 637–640, 669, 671, 680, 692, 700, 717, 778, 783, 784, 353, 404, 435, 437; 430/312–314, 297–299

(56) References Cited

U.S. PATENT DOCUMENTS

| | | | | |
|---|---|---|---|---|
| 4,496,419 | * | 1/1985 | Nulman et al. | 156/643 |
| 5,124,273 | * | 6/1992 | Minami | 716/14 |
| 5,275,913 | * | 1/1994 | Lin | 430/252 |
| 5,798,559 | * | 8/1998 | Bothra et al. | 257/522 |
| 6,008,116 | * | 12/1999 | Tran | 438/623 |

OTHER PUBLICATIONS

Webster's II New College Dictionary, Houghton Mifflin Company, p. 106, 1995.*

* cited by examiner

*Primary Examiner*—John F. Niebling
*Assistant Examiner*—Ha Tran Nguyen

(57) ABSTRACT

A method is described. A substrate is provided. A first conductive layer with a first width and a second conductive layer with a second width are formed on the substrate. Photolithography and etching processes are performed on the dielectric layer to at least expose a first region of the first conductive layer and a second region of the second conductive layer. An oxide layer is then formed over the dielectric layer and the exposed first and second conductive layers. The method of applying partial reverse mask is able to resolve the adhesion problem of the dielectric layer with low dielectric constant.

21 Claims, 4 Drawing Sheets

METHOD OF APPLYING PARTIAL REVERSE MASK

BACKGROUND OF THE INVENTION

1. Field of the Invention

The invention relates in general to an application of a partial reverse mask. More particularly, the present invention relates to a method of applying the partial reverse mask on a dielectric layer with a low dielectric constant.

2. Description of the Related Art

In the manufacturing of very large scale integrated (VLSI) semiconductors, multilevel interconnects, fabricated from two or more metal interconnect layers above a wafer, are quite common. The purpose of having multilevel interconnects is to increase three-dimensional wiring line structures so that the densely packed devices can be properly linked together. In general, the first layer of wiring lines can be made from polysilicon or a metal, and can be used to electrically couple the source/drain regions of devices in the substrate. In other words, through the formation of vias, devices in substrate are electrically connected together. For connecting more devices, a second or more layers of metallic wiring can be used. With the increase in level of integration, a capacitor effect between metallic lines, which can lead to RC delay and cross talk between vias, increases correspondingly. Consequently, speed of conduction between metallic lines is slower. Therefore, to reduce the capacitor effect, a type of low-k dielectric material is now commonly used for forming inter-layer dielectric or inter-metal dielectric (ILD/IMD) layers. The low-k dielectric material, for example, FSG, is quite effective in reducing RC delay between metallic lines. In practice, however, there are a number of technical problems regarding the use of low-k dielectric that still need to be addressed. One of them is the poor adhesive ability of the low-k material.

SUMMARY OF THE INVENTION

It is therefore an object of the invention to provide a method of applying a partial reverse mask for improving the problem of poor adhesion.

The invention achieves the above-identified object by providing a method of applying a partial reverse mask. A method for applying the partial reverse mask is provided. A substrate is provided. A first conductive layer with a first width and a second conductive layer with a second width is formed on the substrate. A dielectric layer is formed on the first and second conductive layers. Photolithography and etching processes are performed on the dielectric layer to at least expose a first region of the first conductive layer and a second region of the second conductive layer. An oxide layer is then formed over the dielectric layer and the exposed first and second conductive layers.

The invention achieves the above-identified object by providing another method of applying a partial reverse mask. A method for applying the partial reverse mask is provided. A substrate is provided. A first conductive layer with a first width and a second conductive layer with a second width is formed on the substrate by using a first mask having a first pattern with the first width and a second pattern with the second width. A dielectric layer is formed on the first and second conductive layer. The first mask is reversed to form a second mask, the second mask has a third pattern with a third width, wherein the third width has a value obtained by deducting a M and S values from the first width. The M value is about half of the first width A1 (FIG. 1B). The S value is a bias or deviation value of the metal width. An oxide layer is formed over the dielectric layer and the exposed first conductive layer.

The invention achieves the above-identified object by providing another method of applying a partial reverse mask. A method for applying the partial reverse mask is provided. A substrate is provided. A first conductive layer with a first width and a second conductive layer with a second width is formed on the substrate by using a first mask having a first pattern with the first width and a second pattern with the second width. A dielectric layer is formed on the first and second conductive layer. A plurality of openings is formed in the dielectric layer exposing a position corresponding to the first and second conductive layers by using a second mask having a third pattern with a third width and a fourth pattern with a fourth width, wherein the third width has a value obtained by deducting a bias from the first width and the fourth width has a value obtained by deducting the bias from the second width. An oxide layer is formed over the dielectric layer and the exposed first and second conductive layers.

BRIEF DESCRIPTION OF THE DRAWINGS

Other objects, features, and advantages of the invention become apparent from the following detailed description of the preferred but non-limiting embodiments. The description is made with reference to the accompanying drawings in which.

DESCRIPTION OF THE PREFERRED EMBODIMENT

Figure 1A:
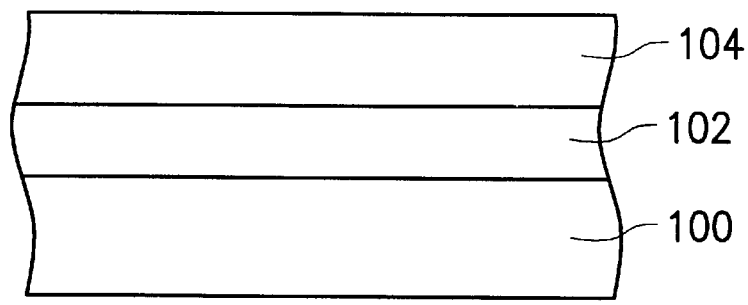
FIGS. 1A to 1F are schematic, cross-sectional views showing the process steps of one preferred embodiment of the method of applying a partial reverse mask to a dielectric layer with low dielectric constant.

As shown in FIG. 1A, a substrate 100 with preformed semiconductor devices (not shown) is provided. A detailed description of the preformed semiconductor devices, such as conductive structures, is omitted here because it is less relevant to the processes of the present invention.

A conductive layer 102, for example, a metal layer, is formed on the substrate 100 by, for example, chemical vapor deposition or a sputtering process, depended on a specificity of the conductive layer 102. A photoresist layer 104 is then formed on conductive layer 102.

Figure 1B:
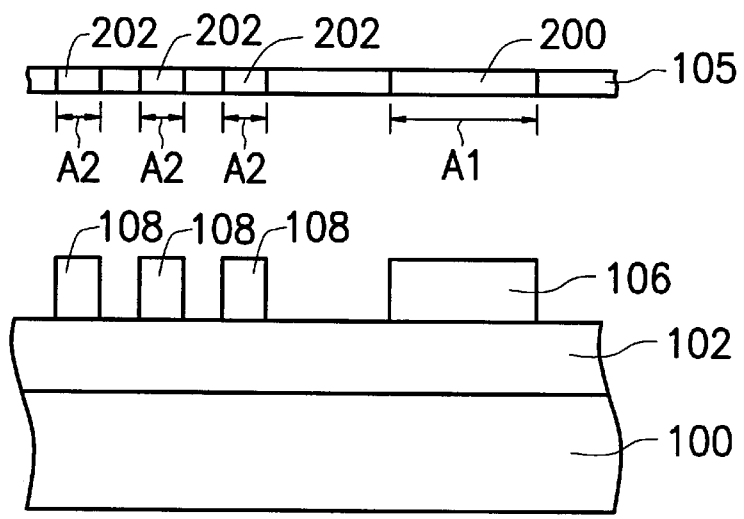
Figure 1C:
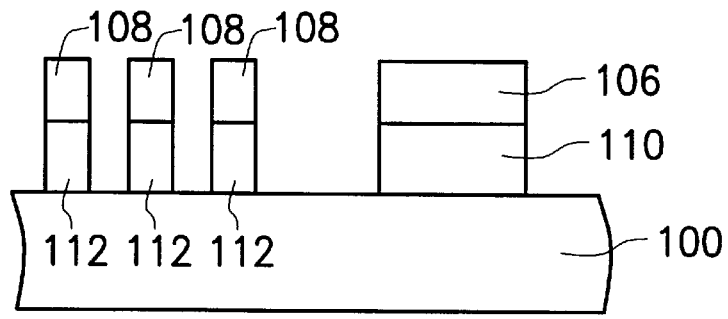

As shown in FIG. 1B, a first mask 105 is used and photolithography and etching methods are performed to pattern the photoresist layer 104. Several broader patterns 200 and narrow patterns 202 are formed on the first mask 105. Patterns 200 and 202 are either transparent or opaque to light. Broader photoresist layers 106 with a width of A1 and narrow photoresist layers 108 with a width of A2 are formed by the photolithography and etching processes. The conductive layer 102 is then etched by using the broader and narrow photoresist layers 106 and 108 as masks. Broader conductive layers 110 patterned with a width of A1 and narrow conductive layers 112 with a width of A2 are formed after the etching step is performed, as shown in FIG. 1C.

Figure 1D:
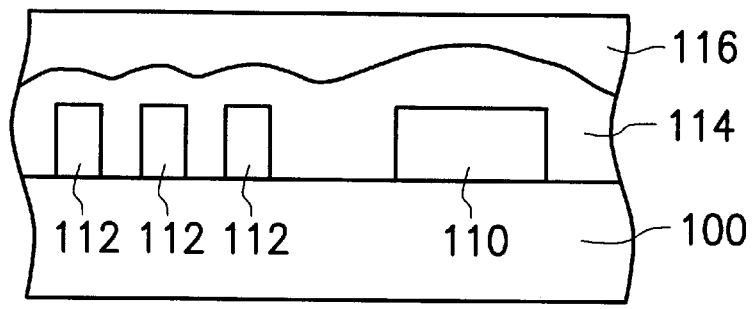
Figure 1E:
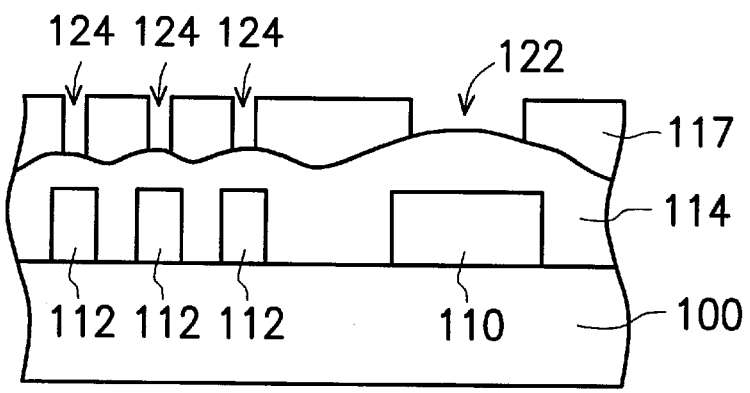

Referring to FIG. 1D, photoresist layers 106 and 108 are removed by, for example, an ashing method after the conductive layers 110 and 112 are formed. A dielectric layer 114 having, for example, a low dielectric constant, is then formed on the conductive layers 110 and 112 and the substrate 100. A chemical vapor deposition or high-density plasma chemical vapor deposition (HDPCVD) can be used to form the dielectric layer 114; it is to be understood that the invention is not limited thereto. A photoresist layer 116 is then formed on the dielectric layer 114.

A second mask 118 is used and photolithography and etching steps are performed to pattern the photoresist layer 116. The second mask 118 is a partial reverse mask of the first mask 105. There are several broader patterns 300 and narrow patterns 302 formed in the second mask 118, because of the broader patterns 200 and narrow patterns 202 formed on the first mask 105. Both the broader patterns 300 and narrow patterns 302 are either transparent or opaque to light. The broader patterns 300 and narrow patterns 302 have widths narrower than that of the patterns 200 and 202, respectively.

Openings, for example, openings 122 and 124, are formed in the photoresist layer 116, which becomes photoresist layer 117 for exposing the dielectric layer 114. The exposed dielectric layer 114 is corresponded to the conductive layers 110 and 112.

Figure 1F:
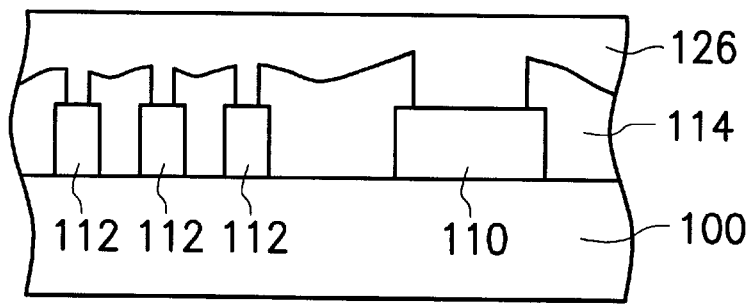

Referring to FIG. 1F, the portions of the dielectric layer 114 exposed by the photoresist layer 117 are removed by a conventional etching process until the underlying conductive layers 112 and 110 are exposed. The photoresist layer 117 is then removed.

An oxide layer 126 is then formed on the dielectric layer 114 and the exposed conductive layers 112 and 110 by a conventional deposition process such as plasma enhanced chemical vapor deposition.

The oxide layer 126 is planarized by, for example, chemical mechanical polishing. A subsequent step, such as a deposition process of a metal layer (not shown), is performed to cover the dielectric layer 114.

The patterns of the partial reverse mask 118 according to the present invention have widths obtained by deducting an S value from the sizes of the first mask 105 so that large patterns 300 and small patterns 302 are formed, respectively. The S value is preferably a bias of the metal width, for example, about 0.1 to 0.5 micrometers. The values of the M and S are dependent on the design rule and process window and can be obtained by the calculation of the computer.

The corresponding portions of the dielectric layer 114 above the conductive layers 110 and 112 are removed; hence the adhesion problem of the dielectric layer in the prior art is improved according to the present invention. Moreover, no peeling effect occurs on the metal layer (not shown) even when the subsequent process, for example, a chemical mechanical polishing process, is performed.

Another preferred method for applying a partial reverse mask to a dielectric layer with low dielectric constant is illustrated as shown in FIGS. 2A through 2F.

Figure 2A:
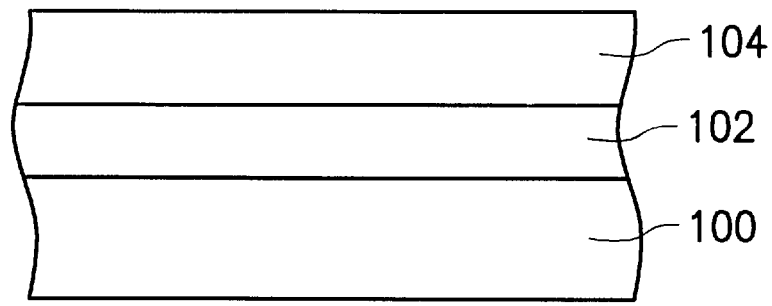
FIGS. 2A to 2F are schematic, cross-sectional views showing the process steps of one preferred embodiment of the method of applying a partial reverse mask to a dielectric layer with low dielectric constant.
Figure 2B:
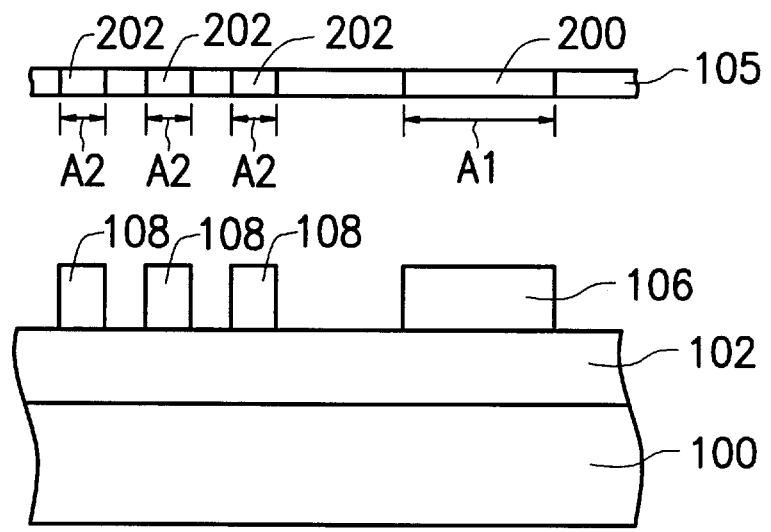
Figure 2C:
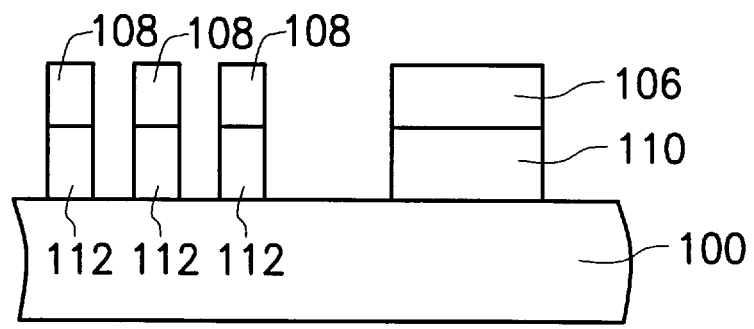

A detailed description of the processes with respect to FIGS. 2A through 2C are omitted here because they are similar to the processes of FIGS. 1A through 1C.

Figure 2D:
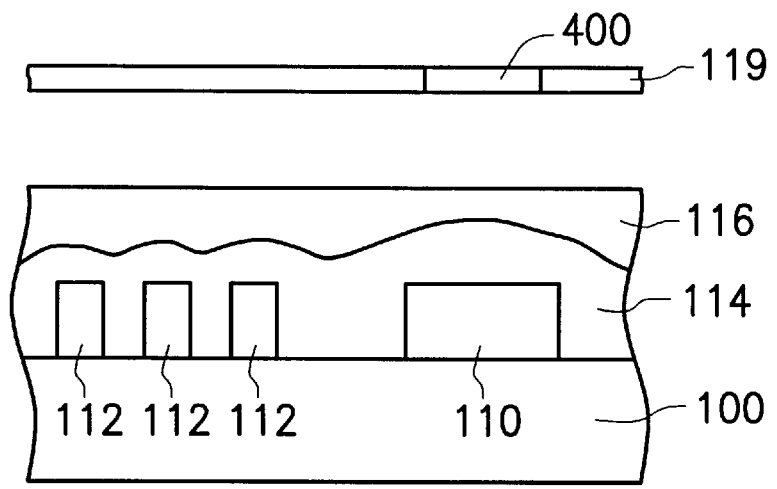
Figure 2E:
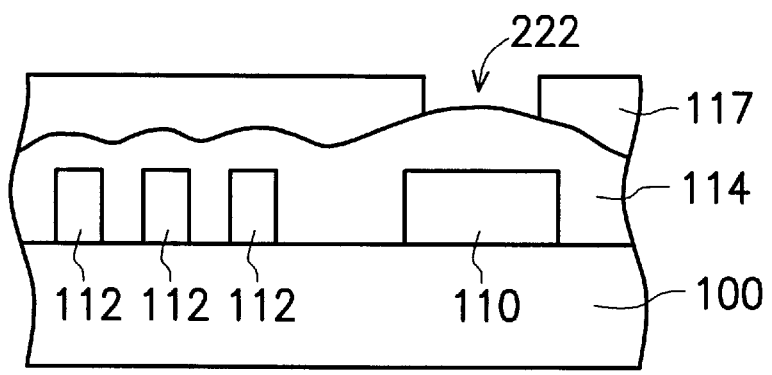

Referring to FIG. 2D, photoresist layers 106 and 108 are removed after the conductive layers 110 and 112 are formed. A dielectric layer 114 having, for example, a low dielectric constant, is then formed on the conductive layers 110 and 112 and the substrate 100. A chemical vapor deposition or high-density plasma chemical vapor deposition (HDPCVD) can be used to form the dielectric layer 114; it is to be understood that the invention is not limited thereto. A photoresist layer 116 is then formed on the dielectric layer 114.

A third mask 119 is used and photolithography and etching steps are performed to pattern the photoresist layer 116. The Third mask 119 is a partial reverse mask of the first mask 105. There is a broader pattern 400 formed in the third mask 119, because of the broader pattern 200 formed on the first mask 105. The broader pattern 400 is either transparent or opaque to light. The broader pattern 400 has a width narrower than that of the pattern 200.

Opening, for example, opening 222 is formed in the photoresist layer 116, which becomes photoresist layer 117 for exposing the dielectric layer 114. The exposed dielectric layer 114 is corresponded to the conductive layer 110.

Figure 2F:
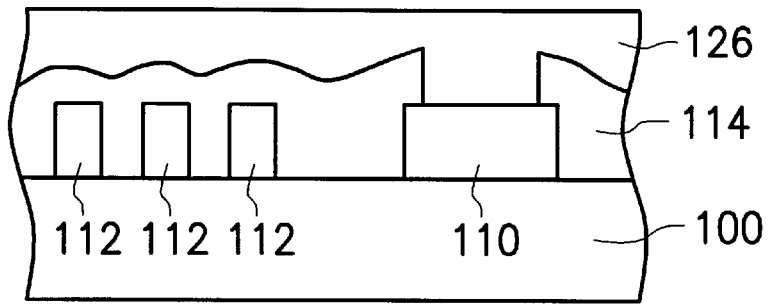

Referring to FIG. 2F, the portion of the dielectric layer 114 exposed by the photoresist layer 117 is removed by a conventional etching process until the underlying conductive layers 110 is exposed. The photoresist layer 117 is then removed.

An oxide layer 126 is then formed on the dielectric layer 114 and the exposed conductive layers 110 by a conventional deposition process such as plasma enhanced chemical vapor deposition.

The oxide layer 126 is planarized by, for example, chemical mechanical polishing. A subsequent step, such as a deposition process of a metal layer (not shown), is performed to cover the dielectric layer 114.

The peeling effect always occurs on a conductive layer with large dimensions and seldom occurs on a conductive layer with small dimensions. The pattern of the third mask 119 is obtained by reversing the first mask 105. The width of the pattern of the third mask 119 is calculated by the addition of a M value followed by the deduction of a S value to the width of the pattern of the first mask 105, so that only the broader pattern 400 is formed on the third mask 119. The M value is about half of the A1. The S value is preferably a bias of the metal width. Both the S and M values are, for example, about 0.1 to 0.5 micrometers. The values of the M and S are dependent on the design rule and process window and can be obtained by computer calculation.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of applying a partial reverse mask, comprising the steps of:

providing a substrate;

forming a plurality of first conductive layers with a first width and a plurality of second conductive layers with a second width on the substrate, wherein the first width is greater than the second width;

forming a dielectric layer over the first conductive layers and second conductive layers;

patterning the dielectric layer to at least expose a first region of the first conductive layers and a second region of the second conductive layers; and forming an oxide layer over the exposed first region of the first conductive layers and the exposed second region of the second conductive layers.

2. The method according to claim 1, wherein the first region has a dimension smaller than that of the first conductive layers.

3. The method according to claim 1, wherein the second region has a dimension smaller than that of the second conductive layers.

4. The method according to claim 1, wherein the dielectric layer is formed of materials with a low dielectric constant.

5. The method according to claim 1, wherein after the step of forming the oxide layer, further comprises the step of performing chemical mechanical polishing on the oxide layer.

6. The method according to claim 5, wherein after the step of performing the chemical mechanical polishing, further comprises the step of forming a metal layer over the oxide layer.

7. A method of applying a partial reverse mask, comprising the steps of:

providing a substrate;

forming a first conductive layer with a first width and a second conductive layer with a second width on the substrate by using a first mask having a first pattern with the first width and a second pattern with the second width, wherein the first width is greater than the second width;

forming a dielectric layer over the first and second conductive layers;

forming a plurality of openings in the dielectric layer exposing a position corresponding to the first and second conductive layers by using a second mask having a third pattern with a third width and a fourth pattern with a fourth width, wherein the third width has a value obtained by deducting a bias from the first width and the fourth width has a value obtained by deducting the bias from the second width; and forming an oxide layer over the dielectric layer and the exposed first and second conductive layers.

8. The method according to claim 7, wherein the second mask is a reverse mask of the first mask.

9. The method according to claim 7, wherein the dielectric layer is formed of materials with a low dielectric constant.

10. The method according to claim 7, wherein after the step of forming the oxide layer, further comprises the step of performing a chemical mechanical polishing on the oxide layer.

11. The method according to claim 10, wherein after the step of performing the chemical mechanical polishing, further comprises the step of forming a metal layer over the oxide layer.

12. The method according to claim 7, wherein the bias has a value in a range of from about 0.1 to 0.5 micrometers.

13. The method according to claim 7, wherein the first, second, third and fourth patterns are obtained by a calculation of a computer.

14. A method of applying a partial reverse mask, comprising the steps of:

providing a substrate;

forming a first conductive layer with a first width and a second conductive layer with a second width on the substrate by using a first mask having a first pattern with the first width and a second pattern with the second width;

forming a dielectric layer on the first and second conductive layer;

forming an opening in the dielectric layer exposing the position corresponding to the first conductive layer by reversing the first mask to form a second mask, the second mask having a third pattern with a third width, wherein the third width has a value obtained from the first width, after deducing a M and a S value from the first width, wherein the M value is about half of the value of the first width and the S value is a bias or deviation value of the metal width; and forming an oxide layer over the dielectric layer and the exposed first conductive layer.

15. The method according to claim 14, wherein the M value is in a range of from about 0.1 to 0.5 micrometers.

16. The method according to claim 14, wherein the step of reversing the first mask furthers includes the step of removing the second pattern of the first mask.

17. The method according to claim 14, wherein the dielectric layer is formed of materials with a low dielectric constant.

18. The method according to claim 14, wherein the S value is in a range of from about 0.1 to 0.5 micrometers.

19. The method according to claim 14, wherein the first, second and third patterns are obtained by a calculation of a computer.

20. The method according to claim 14, wherein after the step of forming the oxide layer, further comprises the step of performing a chemical mechanical polishing process on the oxide layer.

21. The method according to claim 14, wherein after the step of performing the chemical mechanical polishing process, further comprises the step of forming a metal layer over the oxide layer.

* * * * *